(12) United States Patent
Park et al.

(10) Patent No.: US 12,572,087 B2
(45) Date of Patent: Mar. 10, 2026

(54) SUBSTRATE PROCESSING APPARATUS

(71) Applicant: SEMES CO., LTD.,
Chungcheongnam-do (KR)

(72) Inventors: Seojung Park, Goyang-si (KR);
Youngju Jo, Hwaseong-si (KR)

(73) Assignee: SEMES CO., LTD.,
Chungcheongnam-do (KR)

( * ) Notice: Subject to any disclaimer, the term of this
patent is extended or adjusted under 35
U.S.C. 154(b) by 145 days.

(21) Appl. No.: 18/507,000

(22) Filed: Nov. 10, 2023

(65) Prior Publication Data

US 2024/0160118 A1     May 16, 2024

(30) Foreign Application Priority Data

Nov. 11, 2022     (KR) ......................... 10-2022-0150980

(51) Int. Cl.
*G03F 7/00* (2006.01)
*G03F 7/40* (2006.01)

(52) U.S. Cl.
CPC ............ *G03F 7/70875* (2013.01); *G03F 7/40* (2013.01)

(58) Field of Classification Search
CPC . G03F 7/70875; G03F 7/40; H01L 21/67017;
H01L 21/67103; H01L 21/6719; H01L
21/67748; H01L 21/67109; C23C
16/0209; C23C 16/455; C23C 16/463;
C23C 16/52
See application file for complete search history.

(56) References Cited

U.S. PATENT DOCUMENTS 6,354,832 B1 * 3/2002 Yoshimura ........ H01L 21/67109
432/5
6,413,317 B1 * 7/2002 Miyazaki .......... H01L 21/67109
118/620
(Continued)

FOREIGN PATENT DOCUMENTS

KR     10-2007-0026198     3/2007
KR     10-2015-0023650     3/2015
(Continued)

OTHER PUBLICATIONS

Notice of Allowance dated Dec. 3, 2024 for Korean Patent Application No. 10-2022-0150980 and its English translation from Global Dossier.
(Continued)

*Primary Examiner* — Hung V Nguyen
(74) *Attorney, Agent, or Firm* — WOMBLE BOND DICKINSON (US) LLP

(57) ABSTRACT

A substrate processing apparatus includes a heat treatment chamber providing a heat treatment space for heat-treating a substrate, a cooling chamber arranged apart from the heat treatment chamber in a horizontal direction, and a cover sealing the heat treatment chamber and the cooling chamber, wherein the cooling chamber includes a housing defining a cooling treatment space therein, a cooling plate on which the substrate is placed, a first carry-in/out port arranged in one inner wall of the housing and defining a path through which the substrate is externally carried in/out with respect to the cooling chamber, and a first purge gas supply unit arranged in an inner wall of the housing and providing a first purge gas to the cooling treatment space.

19 Claims, 10 Drawing Sheets

(56) References Cited

U.S. PATENT DOCUMENTS

| | | | |
|---|---|---|---|
| 6,524,389 B1 * | 2/2003 | Katayama | H01L 21/67109 |
| | | | 118/712 |
| 6,644,964 B2 * | 11/2003 | Shirakawa | H01L 21/67109 |
| | | | 118/728 |
| 6,673,155 B2 * | 1/2004 | Nagashima | H01L 21/67248 |
| | | | 118/712 |
| 7,797,855 B2 | 9/2010 | Fukuoka et al. | |
| 11,177,143 B2 * | 11/2021 | Hirochi | H01L 21/67778 |
| 11,714,356 B2 | 8/2023 | Kim et al. | |
| 2010/0330815 A1 | 12/2010 | Hayashi et al. | |
| 2015/0165475 A1 | 6/2015 | Palm et al. | |

FOREIGN PATENT DOCUMENTS

| | | |
|---|---|---|
| KR | 10-2022-0021290 | 2/2022 |
| KR | 10-2022-0028472 | 3/2022 |
| KR | 10-2022-0034304 | 3/2022 |

OTHER PUBLICATIONS

Office Action dated Mar. 20, 2024 for Korean Patent Application No. 10-2022-0150980 and its English translation by Google Translate.

* cited by examiner

SUBSTRATE PROCESSING APPARATUS

CROSS-REFERENCE TO RELATED APPLICATION

This application claims the benefit of Korean Patent Application No. 10-2022-0150980, filed on Nov. 11, 2022, in the Korean Intellectual Property Office, the disclosure of which is incorporated herein in its entirety by reference.

BACKGROUND

1. Field

The disclosure relates to a substrate processing apparatus, and more particularly, to an apparatus for heat-treating a substrate.

2. Description of the Related Art

In order to manufacture a semiconductor device, various processes, such as photolithography, etching, deposition, ion-injection, cleaning, and the like, are performed. Among them, a photolithography process is used to form a pattern, which is important for achieving high integration of a semiconductor device.

The photolithography process generally consists of a coating process, an exposure process, and a development process, and a baking process is performed before or after the exposure process is performed. The baking process is used to heat-treat a substrate, and in this process, after a substrate is placed on a heating plate, the substrate is heat-treated through a heater provided inside the heating plate.

SUMMARY

Provided is a substrate processing apparatus which may maintain a low oxygen saturation during a baking process by including a gas supply unit for providing an inert gas not only in a heat treatment chamber, but also in a cooling treatment chamber.

Provided is a substrate processing apparatus which may maintain a low oxygen saturation during a baking process, by including a cover for sealing the heat treatment chamber and the cooling treatment chamber.

The technical objectives to be achieved by the disclosure are not limited to the above-described objectives, and other technical objectives that are not mentioned herein would be clearly understood by a person skilled in the art from the description of the disclosure.

Additional aspects will be set forth in part in the description which follows and, in part, will be apparent from the description, or may be learned by practice of the presented embodiments.

According to an aspect of the disclosure, a substrate processing apparatus includes a heat treatment chamber providing a heat treatment space for heat-treating a substrate, a cooling chamber arranged apart from the heat treatment chamber in a horizontal direction, and a cover sealing the heat treatment chamber and the cooling chamber, wherein the cooling chamber includes a housing defining a cooling treatment space therein, a cooling plate on which the substrate is placed, a first carry-in/out port arranged in one inner wall of the housing and defining a path through which the substrate is externally carried in/out with respect to the cooling chamber, and a first purge gas supply unit arranged in an inner wall of the housing and providing a first purge gas to the cooling treatment space.

In an embodiment, the substrate processing apparatus may further include a controller configured to control a supply of the first purge gas by the first purge gas supply unit.

In an embodiment, the controller may be further configured to control the first purge gas supply unit to inject a first purge gas while the first carry-in/out port is opened.

In an embodiment, the substrate processing apparatus may further include a transfer robot configured to transfer the substrate from the heat treatment chamber to the cooling chamber, wherein the controller may be further configured to control transfer of the substrate by the transfer robot.

In an embodiment, the heat treatment chamber further may include a second purge gas supply unit providing a second purge gas to the heat treatment space, and the controller may be further configured to control a supply of the second purge gas by the second purge gas supply unit.

In an embodiment, the heat treatment chamber further may include a second carry-in/out port defining a path through which the substrate is externally carried in/out with respect to the heat treatment chamber, and the controller may be further configured to control the second purge gas supply unit to inject the second purge gas while the second carry-in/out port is opened.

In an embodiment, the first purge gas supply unit may include a gas injection hole through which the first purge gas is injected, and the gas injection hole may be arranged to face the first carry-in/out port.

In an embodiment, the first purge gas may include an inert gas having a constant temperature.

In an embodiment, the first purge gas may include an inert gas including nitrogen ($N_2$)

According to another aspect of the disclosure, a substrate processing apparatus includes a heat treatment chamber providing a heat treatment space for heat-treating a substrate, a cooling chamber arranged apart from the heat treatment chamber in a horizontal direction, and a cover sealing the heat treatment chamber and the cooling chamber, wherein the cooling chamber may include a housing defining a cooling treatment space therein, a cooling plate on which the substrate is placed, a first carry-in/out port defining a path through which the substrate is externally carried in/out with respect to the cooling chamber, and a first purge gas supply unit providing a first purge gas to the cooling treatment space, and wherein the cover may include a gas supply unit arranged in one side wall inside the cover and providing an inert gas to the inside of the cover, and a discharge unit arranged in the other side wall opposite to the one side wall and discharging the inert gas.

In an embodiment, the substrate processing apparatus may further include a controller configured to control a supply of the first purge gas by the first purge gas supply unit and a supply of the inert gas by the gas supply unit.

In an embodiment, the controller may be further configured to control the gas supply unit to inject the inert gas while the first carry-in/out port is opened.

In an embodiment, the substrate processing apparatus may further include a transfer robot configured to transfer the substrate from the heat treatment chamber to the cooling chamber, wherein the controller may be further configured to control transfer of the substrate by the transfer robot.

In an embodiment, the heat treatment chamber may further include a second purge gas supply unit providing a second purge gas to the heat treatment space, and the controller may be further configured to control a supply of the second purge gas by the second purge gas supply unit.

In an embodiment, the heat treatment chamber further may include a second carry-in/out port defining a path through which the substrate is externally carried in/out with respect to the heat treatment chamber, and the controller may be further configured to control the second purge gas supply unit to inject the second purge gas while the second carry-in/out port is opened.

In an embodiment, the cover may include an entrance defining a path through which the substrate is externally carried in/out, and the controller may be further configured to control the gas supply unit to inject the inert gas while the entrance is opened.

In an embodiment, the controller may be further configured to control the discharge unit to be opened while the gas supply unit injects the inert gas.

In an embodiment, the first purge gas may include an inert gas including nitrogen ($N_2$).

According to another aspect of the disclosure, a substrate processing apparatus includes a heat treatment chamber providing a heat treatment space for heat-treating a substrate, a cooling chamber arranged apart from the heat treatment chamber in a horizontal direction, and a cover sealing the heat treatment chamber and the cooling chamber, wherein the cooling chamber may include a housing defining a cooling treatment space therein, a cooling plate on which the substrate is placed, a first carry-in/out port defining a path through which the substrate is externally carried in/out with respect to the cooling chamber, a first purge gas supply unit arranged in an inner wall of the housing and providing a first purge gas to the cooling treatment space, wherein the heat treatment chamber may include a second purge gas supply unit providing a second purge gas to the heat treatment space, and a second carry-in/out port defining a path through which the substrate is externally carried in/out with respect to the heat treatment chamber, wherein the first purge gas supply unit may include a gas injection hole through which the first purge gas is injected, and arranged to face the first carry-in/out port, and wherein the first purge gas may include an inert gas including nitrogen ($N_2$) and having a constant temperature.

In an embodiment, the substrate processing apparatus may further include a controller configured to control a supply of the first purge gas by the first purge gas supply unit, and a transfer robot configured to transfer the substrate from the heat treatment chamber to the cooling chamber, wherein the controller may be further configured to control the first purge gas supply unit to inject a first purge gas while the first carry-in/out port is opened, control transfer of the substrate by the transfer robot, control a supply of the second purge gas by the second purge gas supply unit, and control the second purge gas supply unit to inject the second purge gas while the second carry-in/out port is opened.

BRIEF DESCRIPTION OF THE DRAWINGS

These and/or other aspects will become apparent and more readily appreciated from the following description of the embodiments, taken in conjunction with the accompanying drawings in which:

FIG. 1 is a view schematically showing a substrate processing apparatus according to an embodiment;

FIG. 2 is a cross-sectional view of the substrate processing apparatus of FIG. 1 when viewed from a direction A-A;

FIG. 5 is a schematic view showing a controller, a transfer robot, a heat treatment chamber, and a cooling chamber;

FIGS. 6A and 6B are schematic views showing a mechanism among the controller, the transfer robot, and a purge gas supply unit;

DETAILED DESCRIPTION

Figure 3:
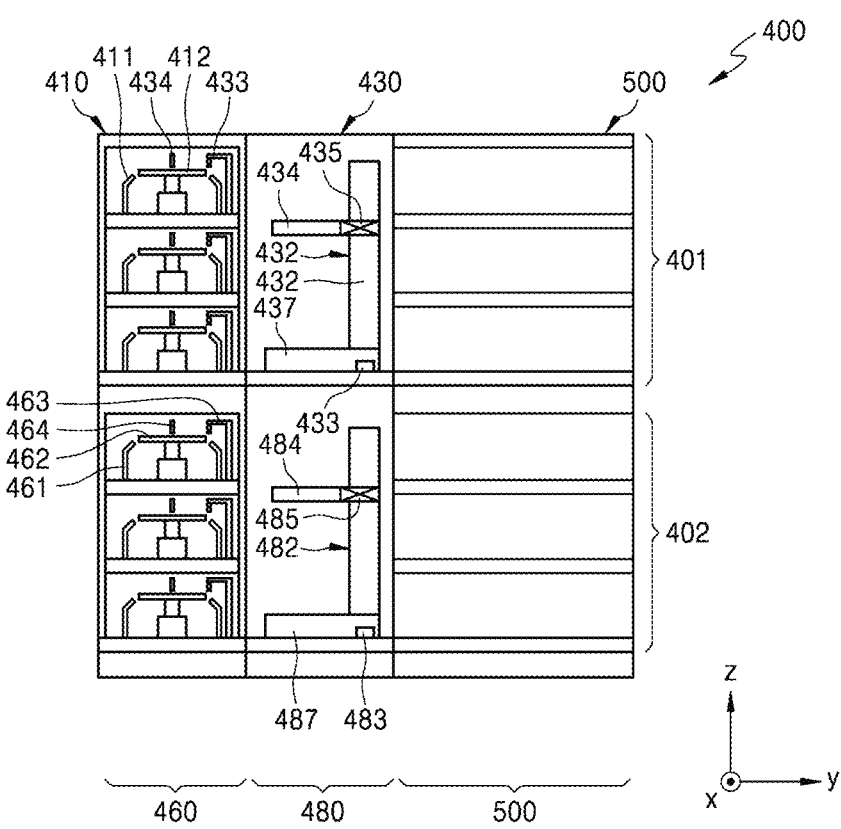
FIG. 3 is a cross-sectional view of the substrate processing apparatus of FIG. 1 when viewed from a direction B-B.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Hereinafter, embodiments of the disclosure will be described in detail with reference to the accompanying drawings. However, the disclosure does not have to be configured as limited to the embodiments described below and may be embodied in various other forms. The following embodiments are not provided to fully complete the disclosure, but rather to fully convey the scope of the disclosure to those skilled in the art.

Figure 1:
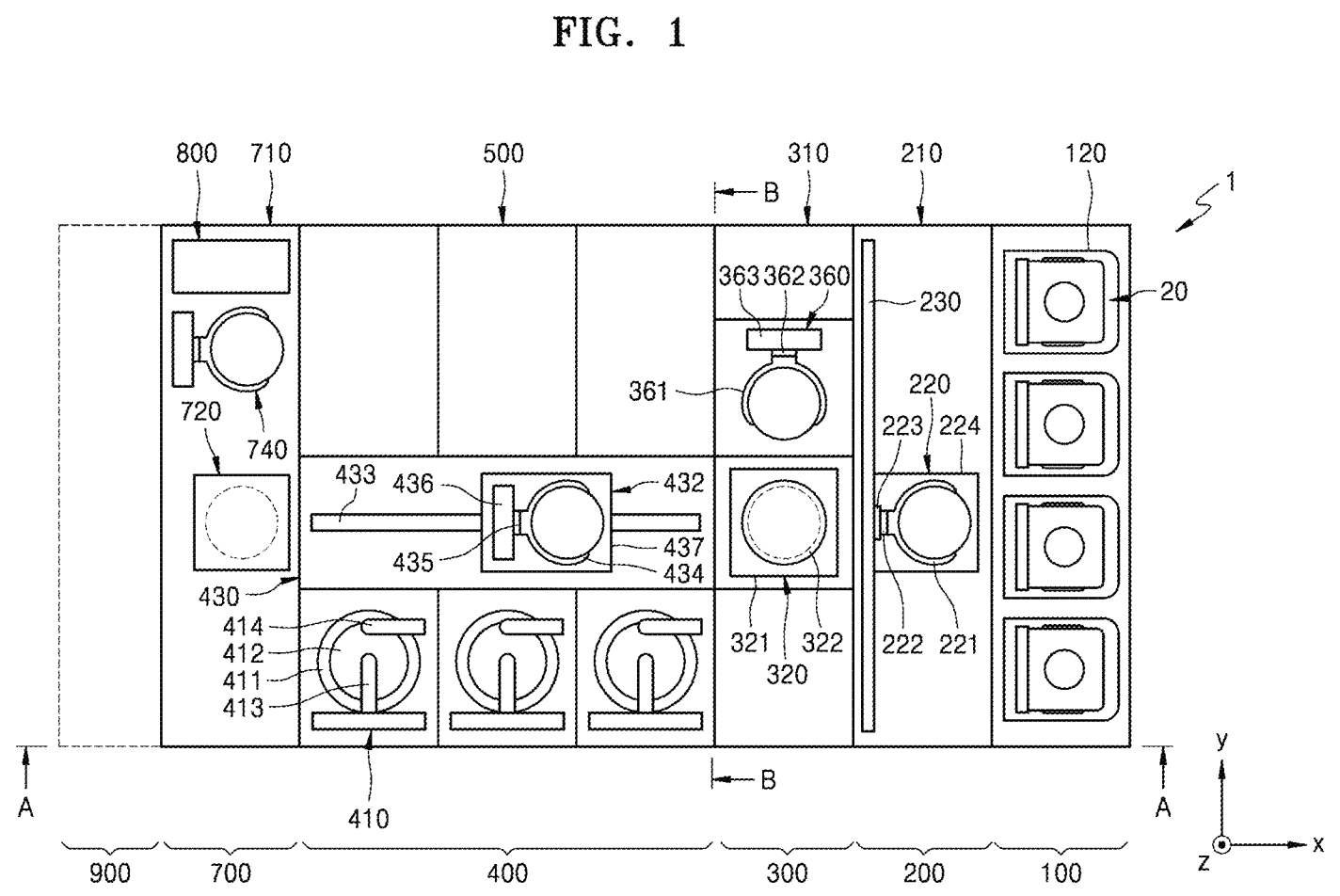
Figure 2:
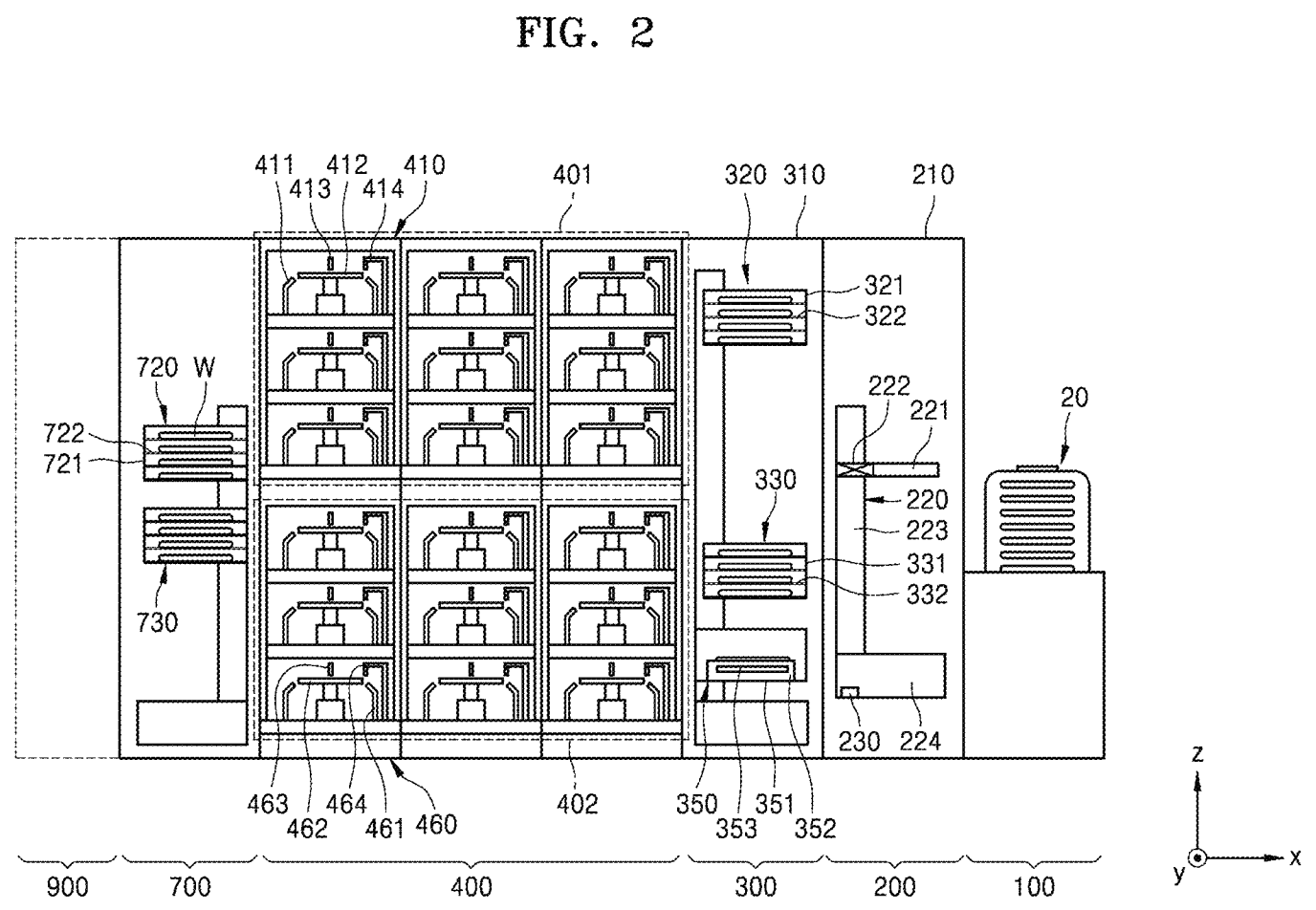

FIGS. 1 to 3 are schematic views showing a substrate processing apparatus 1 according to an embodiment. FIG. 1 is a plan view of the substrate processing apparatus 1, and FIG. 2 is a cross-sectional view of the substrate processing apparatus 1 of FIG. 1 when viewed from a direction A-A. FIG. 3 is a cross-sectional view of the substrate processing apparatus 1 of FIG. 1 when viewed from a direction B-B.

Referring to FIGS. 1 to 3, the substrate processing apparatus 1 includes a load port 100, an index module 200, a buffer module 300, a coating and developing module 400, an interface module 700, and a purge module 800. The load port 100, the index module 200, the buffer module 300, the coating and developing module 400, and the interface module 700 are sequentially arranged in a row in one direction. The purge module 800 may be provided in the interface module 700. Unlike the above, the purge module 800 may be provided at various positions, such as a position at the rear end of the interface module 700 where an exposure device is connected, in a side portion of the interface module 700, or the like.

Hereinafter, a direction in which the load port 100, the index module 200, the buffer module 300, the coating and developing module 400, and the interface module 700 are arranged is referred to as a first direction (x direction). When viewed from the top, a direction perpendicular to the first direction (x direction) is referred to as a second direction (y direction), and a direction perpendicular to each of the first direction (x direction) and the second direction (y direction) is referred to as a third direction (z direction).

A substrate W is moved in a state of being accommodated in a cassette 20. The cassette 20 has a structure sealed from the outside. As an example, a front open unified pod (FOUP) having a door in the front side may be used as the cassette 20.

In the following description, the load port 100, the index module 200, the buffer module 300, the coating and developing module 400, the interface module 700, and the purge module 800 are described. The load port 100 has a susceptor

120 on which the cassette 20 accommodating the substrate W is placed. The susceptor 120 may include a plurality of susceptors, and the susceptors 120 may be arranged in a row in the second direction (y direction). FIG. 1 illustrates four susceptors 120.

The index module 200 transfers the substrate W between the cassette 20 placed on the susceptor 120 of the load port 100 and the buffer module 300. The index module 200 may include a frame 210, an index robot 220, and a guide rail 230. The frame 210 generally has an empty cuboidal shape. The frame 210 is arranged between the load port 100 and the buffer module 300. The frame 210 of the index module 200 may be provided at a height lower than a frame 310 of the buffer module 300 described below. The index robot 220 and the guide rail 230 are arranged inside the frame 210. The index robot 220 has a 4-axis drivable structure to allow a hand 221 directly handling the substrate W to be rotatable and movable in the first direction (x direction), the second direction (y direction), and the third direction (z direction). The index robot 220 include the hand 221, an arm 222, a support 223, and a base 224. The hand 221 is fixedly mounted on the arm 222. The arm 222 has an extractable structure and a rotatable structure. The support 223 is arranged with the length direction thereof aligned in the third direction (z direction). The arm 222 is coupled to the support 23 to be movable along the support 223. The support 223 is fixedly coupled to the base 224. The guide rail 230 is arranged with the length direction thereof aligned in the second direction (y direction). The base 224 is coupled to the guide rail 230 to be movable linearly along the guide rail 230.

Furthermore, although it is not illustrated, the frame 210 is further provided with a door opening for opening/closing a door of the cassette 20.

The buffer module 300 includes the frame 310, a first buffer 320, a second buffer 330, a cooling chamber 350, and a first buffer robot 360. The frame 310 has an empty cuboidal shape, and is arranged between the index module 200 and the coating and developing module 400. The first buffer 320, the second buffer 330, the cooling chamber 350, and the first buffer robot 360 are arranged inside the frame 310. The cooling chamber 350, the second buffer 330, and the first buffer 320 are sequentially arranged upwards in the third direction (z direction). The first buffer 320 is located at a height corresponding to a coating module 401 of the coating and developing module 400 which is described below, and the second buffer 330 and the cooling chamber 350 are provided at a height corresponding to a developing module 402 of the coating and developing module 400 which is described below. The first buffer robot 360 is separated a distance from the second buffer 330, the cooling chamber 350, and the first buffer 320 in the second direction (y direction).

The first buffer 320 and the second buffer 330 each temporarily store the substrate W. The second buffer 330 includes a housing 331 and a plurality of supports 332. The supports 332 are arranged in the housing 331 to be spaced apart from each other in the third direction (z direction). One substrate W is placed on each of the supports 332. The housing 331 has an opening (not shown) in a direction in which the index robot 220 is provided and a direction in which the first buffer robot 360 is provided, so that the index robot 220 and the first buffer robot 360 may carry in or out the substrate W with respect to each of the supports 332 in the housing 331. The first buffer 320 has a structure approximately similar to the second buffer 330. However, a housing 321 of the first buffer 320 has an opening (not shown) in a direction in which the first buffer robot 360 is provided and a direction in which a coating module robot 432 located in the coating module 401 is provided. The number of the supports 322 provided in the first buffer 320 and the number of the supports 332 provided in the second buffer 330 may be identical to or different from each other. In an example, the number of the supports 332 provided in the second buffer 330 may be greater than the number of the supports 322 provided in the first buffer 320.

The first buffer robot 360 transfers the substrate W between the first buffer 320 and the second buffer 330. The first buffer robot 360 includes a hand 361, an arm 362, and a support 363. The hand 361 is fixedly installed to the arm 362. The arm 362 has an extractable structure so that the hand 361 is movable in the second direction (y direction). The arm 362 is coupled to the support 363 to be linearly movable in the third direction (z direction) along the support 363. The support 363 has a length extending from a position corresponding to the second buffer 330 to a position corresponding to the first buffer 320. The support 363 may be longer than the above length in the upper or lower direction. The first buffer robot 360 may be provided such that the hand 361 is capable of only 2-axis driving in the second direction (y direction) and the third direction (z direction).

The cooling chamber 350 cools each substrate W. The cooling chamber 350 includes a housing 351 and a cooling plate 352. The cooling plate 352 has an upper surface on which the substrate W is placed and a cooling device 353 for cooling the substrate W. Various methods, such as cooling using a coolant, cooling using a thermoelectric device, and the like, may be used as the cooling device 353. Furthermore, the cooling chamber 350 may be provided with a lift pin assembly for placing the substrate W on the cooling plate 352. The housing 351 has an opening (not shown) in the direction in which the index robot 220 is provided and a direction in which a developing module robot 482 is provided, so that the index robot 220 and the developing module robot 482 provided in the developing module 402 may carry in or out the substrate W with respect to the cooling plate 352. Furthermore, the cooling chamber 350 may be provided with doors for opening and closing the opening described above.

The coating module 401 includes a resist coating process of coating a photosensitive solution such as photoresist on the substrate W and a heat treatment process of heating and cooling the substrate W before and after the resist coating process. The coating module 401 has a liquid processing chamber 410, a bake unit 500, and a transfer chamber 430. The liquid processing chamber 410, the bake unit 500, and the transfer chamber 430 are sequentially arranged in the second direction (y direction). The liquid processing chamber 410 may be provided as a resist coating chamber 410 that performs a resist application process on the substrate W. The resist coating chamber 410 includes a plurality of resist coating chambers which are arranged in each of the first direction (x direction) and the third direction (z direction). The bake unit 500 includes a plurality of bake units which are arranged in each of the first direction (x direction) and the third direction (z direction).

The transfer chamber 430 is located parallel to the first buffer 320 of the buffer module 300 in the first direction (x direction). The coating module robot 432 and a guide rail 433 are located in the transfer chamber 430. The transfer chamber 430 has an approximately rectangular shape. The coating module robot 432 transfers the substrate W among the bake units 500, the resist coating chambers 410, and the first buffer 320 of the buffer module 300. The guide rail 433 is arranged such that a length direction thereof is parallel to the first direction (x direction). The guide rail 433 guides the coating module robot 432 to linearly move in the first direction (x direction). The coating module robot 432 includes a hand 434, an arm 435, a support 436, and a base 437. The hand 434 is fixedly installed on the arm 435. The arm 435 has an extractable structure so that the hand 434 is movable in the horizontal direction. The support 436 is provided such that a length direction thereof is arranged in the third direction (z direction). The arm 435 is coupled to the support 436 to be linearly movable in the third direction (z direction) along the support 436. The support 436 is fixedly coupled to the base 437, and the base 437 is coupled to the guide rail 433 to be movable along the guide rail 433.

The resist coating chambers 410 all have the same structure. However, the type of photoresist used in each of the resist coating chambers 410 may be different from each other. In an example, chemical amplification resist may be used as the photoresist. The resist coating chamber 410 is provided to coat photoresist on the substrate W. The resist coating chamber 410 includes a housing 411, a support plate 412, and a nozzle 413. The housing 411 has a cup shape with an open upper portion. The support plate 412 is located in the housing 411, and supports the substrate W. The support plate 412 is rotatable. The nozzle 413 supplies photoresist to the substrate W placed on the support plate 412. The nozzle 413 has a circular tube shape, and may supply photoresist to the center of the substrate W. Optionally, the nozzle 413 may have a length corresponding to the diameter of the substrate W, and a discharge hole of the nozzle 413 may be provided as a slit. Furthermore, the resist coating chamber 410 may be further provided with a nozzle 414 for supplying a washing liquid such as deionized water to wash a surface of the substrate W on which photoresist is coated.

Referring to FIGS. 1 to 3, the developing module 402 includes a development process of supplying photoresist and removing a portion of the photoresist to obtain a pattern on the substrate W, and a heat treatment process of heating and cooling the substrate W before and after the development process. The developing module 402 includes a liquid processing chamber 460, the bake unit 500, and a transfer chamber 480. The liquid processing chamber 460, the bake unit 500, and the transfer chamber 480 are sequentially arranged in the second direction (y direction). The liquid processing chamber 460 may be provided as a development chamber. The development chamber 460 and the bake unit 500 are arranged spaced apart from each other in the second direction (y direction) with the transfer chamber 480 therebetween. The development chamber 460 includes a plurality of development chambers which are arranged in each of the first direction (x direction) and in the third direction (z direction).

The transfer chamber 480 is located parallel to the second buffer 330 of the buffer module 300 in the first direction (x direction). The developing module robot 482 and a guide rail 483 are located in the transfer chamber 480. The transfer chamber 480 has an approximately rectangular shape. The developing module robot 482 transfers the substrate W between the bake units 500, the development chambers 460, the second buffer 330 of the buffer module 300, and the cooling chamber 350. The guide rail 483 is arranged such that a length direction thereof is parallel to the first direction (x direction). The guide rail 483 guides the developing module robot 482 to linearly move in the first direction (x direction). The developing module robot 482 includes a hand 484, an arm 485, a support 486, and a base 487. The hand 484 is fixedly installed on the arm 485. The arm 485 has an extractable structure so that the hand 484 is movable in the horizontal direction. The support 486 is provided such that a length direction thereof is arranged in the third direction (z direction). The arm 485 is coupled to the support 486 to be linearly movable in the third direction (z direction) along the support 486. The support 486 is fixedly coupled to the base 487. The base 487 is coupled to the guide rail 483 to be movable along the guide rail 483.

The development chambers 460 all have the same structure. However, the type of a developer used in each development chamber 460 may be different from each other. The development chamber 460 removes an area to which light is irradiated from the photoresist on the substrate W. In this state, an area to which light is irradiated is removed from a protective/passivation film. Optionally, according to the type of photoresist in use, only an area to which light is not irradiated may be removed from areas of the photoresist and the protective/passivation film. The development chamber 460 include a housing 461, a support plate 462, and a nozzle 463. The housing 461 has a cup shape with an open upper portion. The support plate 462 is located in the housing 461, and supports the substrate W. The support plate 462 is rotatable. The nozzle 463 supplies a developer onto the substrate W placed on which the support plate 462. The nozzle 463 has a circular tube shape, and may supply a developer to the center of the substrate W. Optionally, the nozzle 463 has a length corresponding to the diameter of the substrate W, and a discharge hole of the nozzle 463 is provided as a slit. Furthermore, the development chamber 460 may be further provided with a nozzle 464 for supplying a washing liquid such as deionized water to wash the surface of the substrate W on which the developer is supplied.

The heat treatment chamber provided to the developing module 402 may be identical to the bake unit 500 described above.

As described above, in the coating and developing module 400, the coating module 401 and the developing module 402 are provided separated from each other. Furthermore, when viewed from the top, the coating module 401 and the developing module 402 may have the same chamber arrangement.

The interface module 700 transfers the substrate W. The interface module 700 includes a frame 710, a first buffer 720, a second buffer 730, and an interface robot 740. The first buffer 720, the second buffer 730, and the interface robot 740 are located inside the frame 710. The first buffer 720 and the second buffer 730 are separated a certain distance from each other and stacked on each other. The first buffer 720 is arranged higher than the second buffer 730.

The interface robot 740 is arranged apart from the first buffer 720 and the second buffer 730 in the second direction (y direction). The interface robot 740 transports the substrate W among the first buffer 720, the second buffer 730, and an exposure device 900.

The first buffer 720 temporarily stores the substrates WS having been processed before being moved to the exposure device 900. The second buffer 730 temporarily stores the substrates WS having completed a process in the exposure device 900 before being moved. The first buffer 720 includes a housing 721 and a plurality of supports 722. The supports 722 are arranged inside the housing 721, and are arranged apart from each other in the third direction (z direction). One substrate W is placed on each of the supports 722. The housing 721 has an opening (not shown) in a direction in which the interface robot 740 is provided and a direction in which the pretreatment robot 632 is provided, so that the interface robot 740 and the pretreatment robot 632 may carry in or out the substrates W on the supports 722 with respect to the housing 721. The second buffer 730 has a structure similar to the first buffer 720. The interface module 700 may be provided with buffers and robot only as described above without providing a chamber for performing a certain process on a wafer.

Figure 4A:
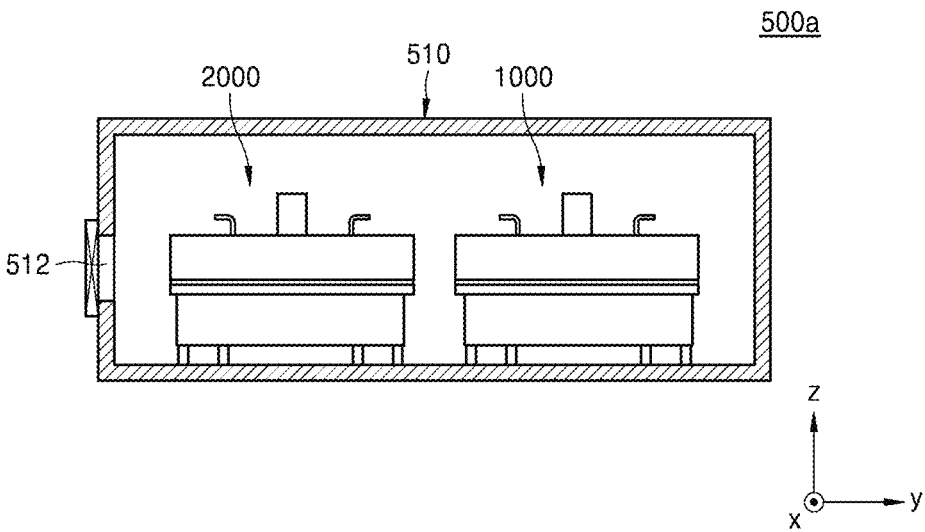
FIGS. 4A and 4B are cross-sectional views of a bake unit illustrated in FIG. 3.
Figure 4B:
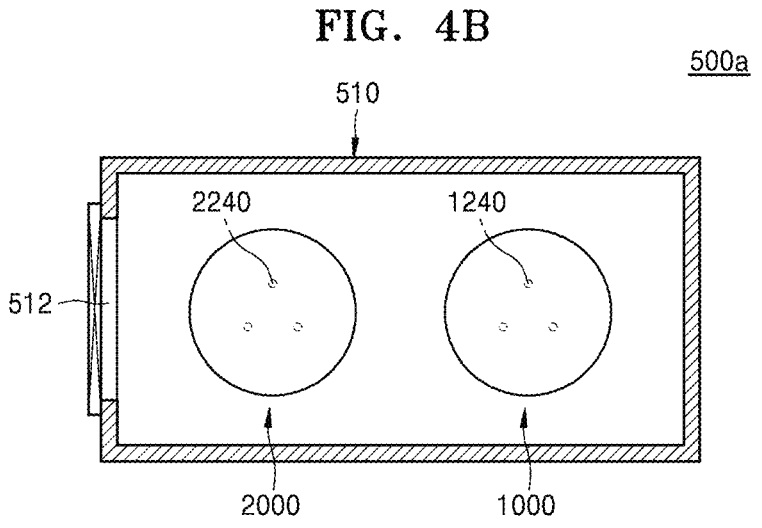

FIGS. 4A and 4B are cross-sectional views illustrating a bake unit 500a, which is an example of the bake unit 500 shown in FIG. 3.

Referring to FIGS. 4A and 4B, the bake unit 500a may include a heat treatment chamber 2000 providing a heat treatment space of heat-treating the substrate W and a cooling chamber 1000 arranged apart from the heat treatment chamber 2000 in the horizontal direction. In the heat treatment chamber 2000, a baking process may be performed on the substrate W with heat of a high temperature. The substrate W having completed a baking process with heat of a high temperature may be transferred to the cooling chamber 1000. A description thereof will be presented later in detail. However, according to an embodiment, the substrate W may wait in the cooling chamber 1000 before a baking process is performed in the heat treatment chamber 2000 with heat of a high temperature, and then may be transferred to the heat treatment chamber 2000 and transferred back to the cooling chamber 1000 to be cooled.

According to an embodiment, the bake unit 500a may include a cover 510 for sealing the heat treatment chamber 2000 and the cooling chamber 1000. Furthermore, the cover 510 may include an entrance 512 providing a path through which the substrate W may be externally carried in/out. Air including oxygen may be introduced into the bake unit 500a through the entrance 512.

For the manufacturing of a precision device, the bake unit 500a may maintain a relatively low oxygen saturation. Accordingly, to prevent air including oxygen from being externally introduced during the baking process, the cover 510 may perform sealing the heat treatment chamber 2000 and the cooling chamber 1000.

According to an embodiment, the heat treatment chamber 2000 and the cooling chamber 1000 may each include a first lift pin 1240 and a second lift pin 2240. Although three first lift pins 1240 and three second lift pins 2240 are illustrated in the drawing, the disclosure is not limited to the above numbers. A plurality of lift pins (1240, 2240) may perform elevating so that the substrate W may be appropriately loaded/unloaded with respect to each of the heat treatment chamber 2000 and the cooling chamber 1000.

Figure 5:
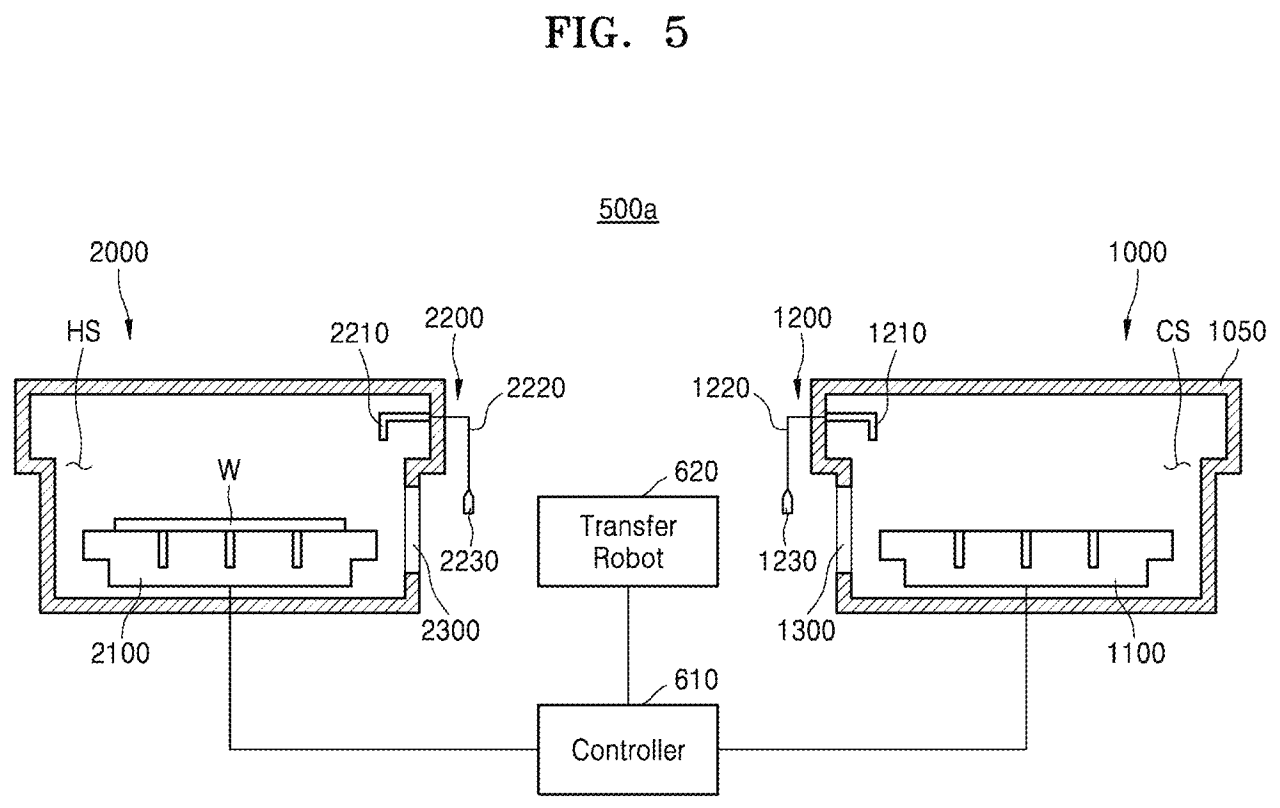

FIG. 5 is a schematic view of a controller 610, a transfer robot 620, the heat treatment chamber 2000, and the cooling chamber 1000.

Referring to FIG. 5, the heat treatment chamber 2000 may include a heating plate 2100 in an inner spaced in which a baking process may be performed. After the substrate W is placed on the heating plate 2100, the heating plate 2100 is maintained at a high temperature so that a baking process may be performed.

The cooling chamber 1000 may include therein a housing 1050 for defining a cooling treatment space CS. The cooling chamber 1000 may include, in the cooling treatment space CS, a cooling plate 1100 for performing a cooling treatment process. After the substrate W is placed on the cooling plate 1100, the cooling plate 1100 is maintained at a low temperature so that the substrate W may be maintained at a low temperature.

According to an embodiment, the bake unit 500a may include the transfer robot 620 for transferring the substrate W from the heat treatment chamber 2000 to the cooling chamber 1000, and the controller 610 for controlling the transfer of the substrate W by the transfer robot 620. The controller 610 may be implemented by hardware, firmware, software, or a combination thereof. For example, the controller 610 may be a computer device, such as a work station computer, a desktop computer, a laptop computer, a tablet computer, and the like. For example, the controller 610 may include a memory device, such as read only memory (ROM), random access memory (RAM), etc., a processor configured to perform a certain calculation and algorithm, such as a microprocessor, a central processing unit (CPU), a graphics processing unit (GPU), etc., and the like According to an embodiment, the cooling chamber 1000 may include a first carry-in/out port 1300 arranged in one inner wall of the housing 1050 and defining a path through which the substrate W is externally carried in/out with respect to the cooling chamber 1000. Furthermore, the cooling chamber 1000 may include a first purge gas supply unit 1200 arranged in the inner wall of the housing 1050 and providing a first purge gas (G1; see FIG. 6B) to the cooling treatment space CS. In this state, the first purge gas supply unit 1200 may include a first gas injection hole 1210 through which a first purge gas G1 is injected, and the first gas injection hole 1210 may be arranged to face the first carry-in/out port 1300. As the substrate W is carried in/out through the first carry-in/out port 1300, air including oxygen may be introduced with the substrate W, and thus, the first purge gas G1 is injected through the first gas injection hole 1210 so that the low oxygen saturation of the cooling treatment space CS may be maintained.

According to an embodiment, the heat treatment chamber 2000 may include a second carry-in/out port 2300 for defining a path through which the substrate W is externally carried in/out with respect to the heat treatment chamber 2000. Furthermore, the heat treatment chamber 2000 may include a second purge gas supply unit 2200 for providing a second purge gas (G2; see FIG. 6A) to a heat treatment space HS in the heat treatment chamber 2000. In this state, the second purge gas supply unit 2200 may include a second gas injection hole 2210 through which a second purge gas G2 is injected, and the second gas injection hole 2210 may be arranged to face the second carry-in/out port 2300. As the substrate W is carried out from the heat treatment chamber 2000 through the second carry-in/out port 2300, air including oxygen may be introduced with the substrate W, and thus, the second purge gas G2 is injected through the second gas injection hole 2210 so that the low oxygen saturation of the heat treatment space HS may be maintained.

According to an embodiment, a plurality of purge gas supply units (1200, 2200) may each include a plurality of supply lines (1220, 2220) and storages (1230, 2230). In detail, the first purge gas supply unit 1200 may include a first storage 1230 for storing the first purge gas G1, and a first supply line 1220 through which the first purge gas G1 is supplied from the first storage 1230 to the first gas injection hole 1210. Likewise, the second purge gas supply unit 2200 may include a second storage 2230 for storing the second purge gas G2, and a second supply line 2200 through which the second purge gas G2 is supplied from the second storage 2230 to the second gas injection hole 2210.

According to an embodiment, the first purge gas G1 and the second purge gas G2 may be an inert gas including nitrogen ($N_2$). Furthermore, the first purge gas G1 and the second purge gas G2 may be an inert gas having a constant temperature when being supplied to a cooling processing space (CS) or the heat treatment space HS through a plurality of purge gas supply units (1200, 2200).

Figure 6A:
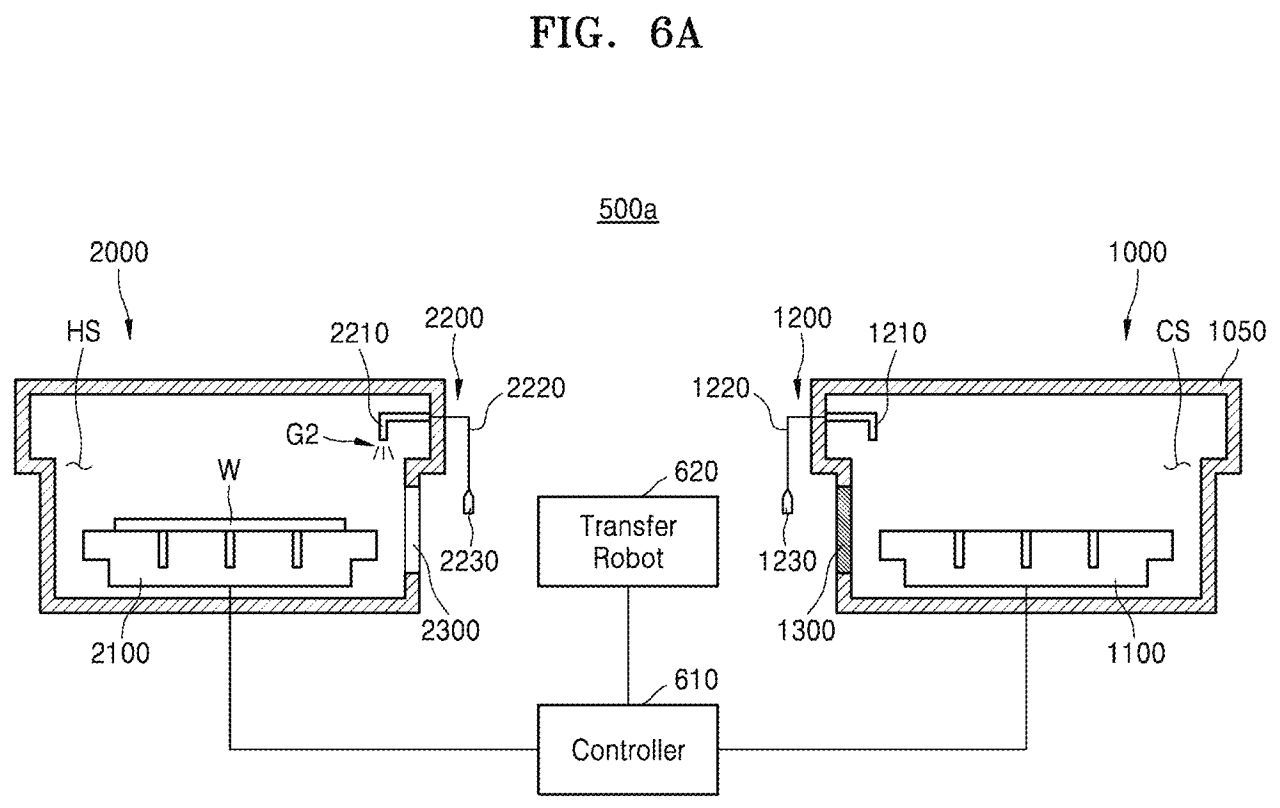
Figure 6B:
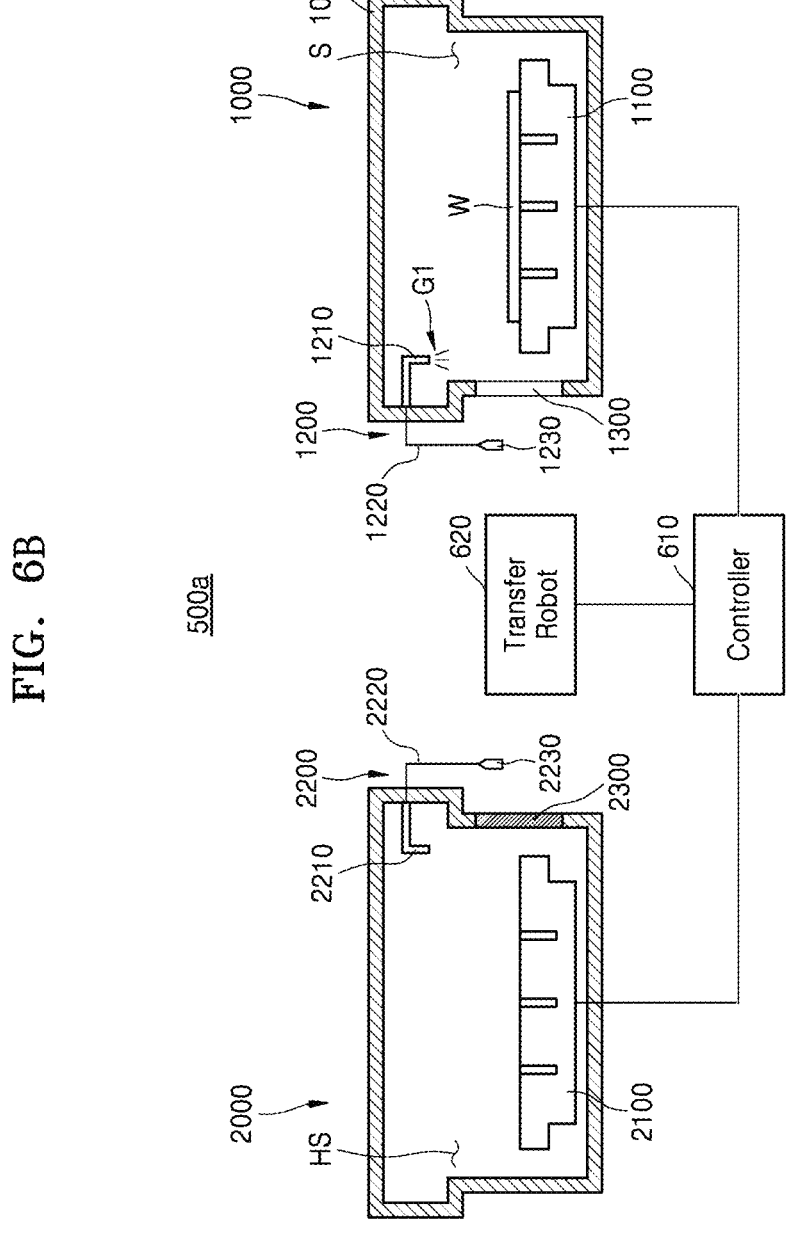

FIGS. 6A and 6B are schematic views of the mechanism among the controller 610, the transfer robot 620, and a plurality of purge gas supply units (1200, 2200).

Referring to FIG. 6A, the second carry-in/out port 2300 of the heat treatment chamber 2000 is open, and the first carry-in/out port 1300 of the cooling chamber 1000 is closed. The controller 610 may be configured to control a supply of the second purge gas G2 of the second purge gas supply unit 2200. As the second carry-in/out port 2300 of the heat treatment chamber 2000 is opened, the substrate W may be introduced into the heat treatment chamber 2000. In this state, air including oxygen may be introduced into the heat treatment chamber 2000.

The controller 610 may control a supply of the second purge gas G2 of the second purge gas supply unit 2200. As illustrated in FIG. 6A, while the second carry-in/out port 2300 of the heat treatment chamber 2000 is open, the controller 610 may control the second purge gas supply unit 2200 to inject the second purge gas G2. As the substrate W is carried in the heat treatment chamber 2000 through the second carry-in/out port 2300, air including oxygen may in introduced with the substrate W, and thus, the second purge gas G2 is injected through the second gas injection hole 2210 so that the low oxygen saturation of the heat treatment space HS may be maintained.

Referring to FIG. 6B, the first carry-in/out port 1300 of the cooling chamber 1000 is opened, and the second carry-in/out port 2300 of the heat treatment chamber 2000 is closed. The controller 610 may be configured to control a supply of the first purge gas G1 of the first purge gas supply unit 1200. As the first carry-in/out port 1300 of the cooling chamber 1000 is opened, the substrate W may be introduced into the cooling chamber 1000. In this state, air including oxygen may be introduced into the cooling chamber 1000.

The controller 610 may control a supply of the first purge gas G1 of the first purge gas supply unit 1200. As illustrated in FIG. 6B, while the first carry-in/out port 1300 of the cooling chamber 1000 is open, the controller 610 may control the first purge gas supply unit 1200 to inject the first purge gas G1. As the substrate W is carried in the cooling chamber 1000 through the first carry-in/out port 1300, air including oxygen may be introduced with the substrate W, and thus, the first purge gas G1 is injected through the first gas injection hole 1210 so that the low oxygen saturation of the cooling treatment space CS may be maintained.

Figure 7:
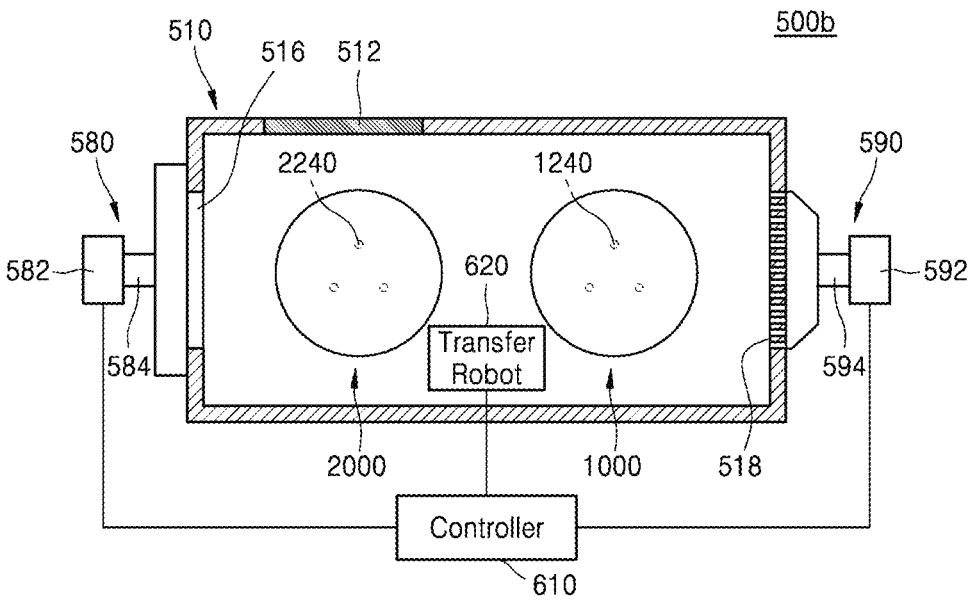
FIG. 7 is a cross-sectional view of a bake unit included in a substrate processing apparatus according to another embodiment.

FIG. 7 is a cross-sectional view of a bake unit 500b included in the substrate processing apparatus 1 according to another embodiment.

The bake unit 500b of FIG. 7 is substantially the same as the bake unit 500a illustrated in FIGS. 4A to 6B, except that the cover 510 for sealing the cooling chamber 1000 and the heat treatment chamber 2000 further includes a gas supply unit 580 and a discharge unit 590. Accordingly, redundant descriptions of the constituent elements of the bake unit 500a illustrated in FIGS. 4A to 6B are omitted.

According to an embodiment, the cover 510 may include the gas supply unit 580 arranged in one side wall of the cover 510 and supplying an inert gas to the inside of the cover 510. Furthermore, the cover 510 may include the discharge unit 590 arranged in the other side wall opposite to the one side wall and through which the inert gas is discharged.

The gas supply unit 580 may include a main supply duct 582 provided in one side of the cover 510, and a supply line 584 branched from the main supply duct 582 and connected to a supply hole 516. Furthermore, the discharge unit 590 may include a main discharge duct 592 provided in the other side of the cover 510, and a discharge line 594 branched from the main discharge duct 592 and connected to a discharge hole 518.

The controller 610, as described with reference to FIGS. 5, 6A, and 6B, may be configured to control the transfer of the substrate W by the transfer robot 620. Furthermore, the controller 610 may be configured to control the supply of the first purge gas G1 of the first purge gas supply unit 1200 of the cooling chamber 1000 of FIG. 5 and the supply of the second purge gas G2 of the second purge gas supply unit 2200 of FIG. of the heat treatment chamber 2000. The control of the first purge gas supply unit 1200 and the second purge gas supply unit 2200 by the controller 610 is identical to the descriptions presented with reference to FIGS. 6A and 6B.

According to an embodiment, the cover 510 may include the entrance 512 for defining a path through which the substrate W may be externally carried in/out.

Figure 8A:
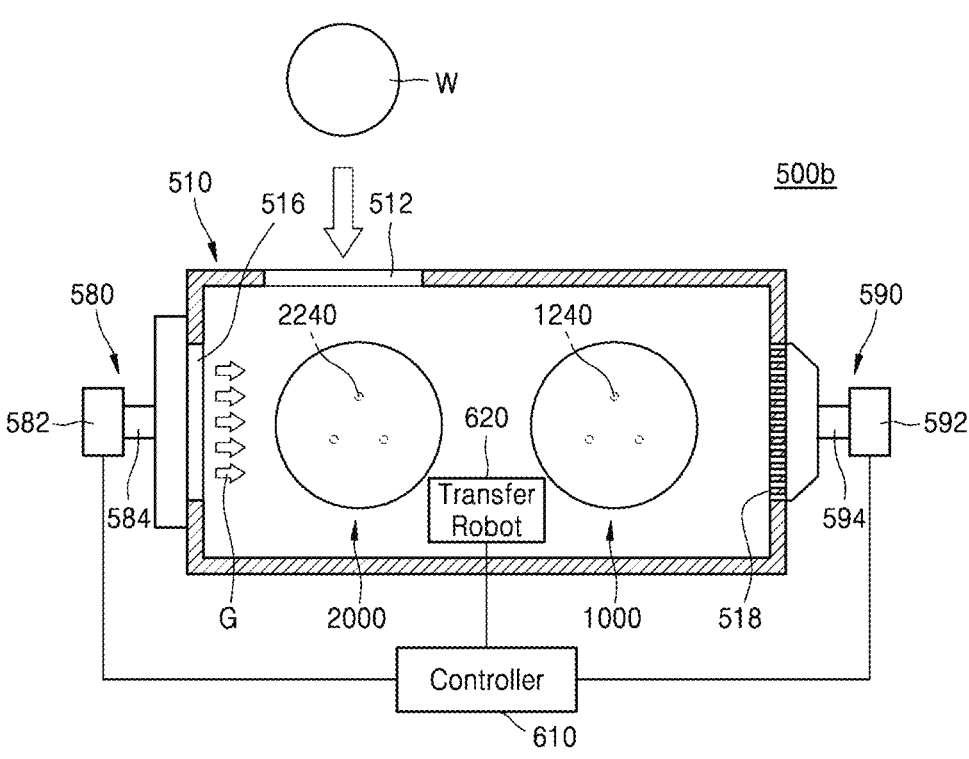
FIGS. 8A and 8B are schematic views showing a mechanism between the controller and the gas supply unit.
Figure 8B:
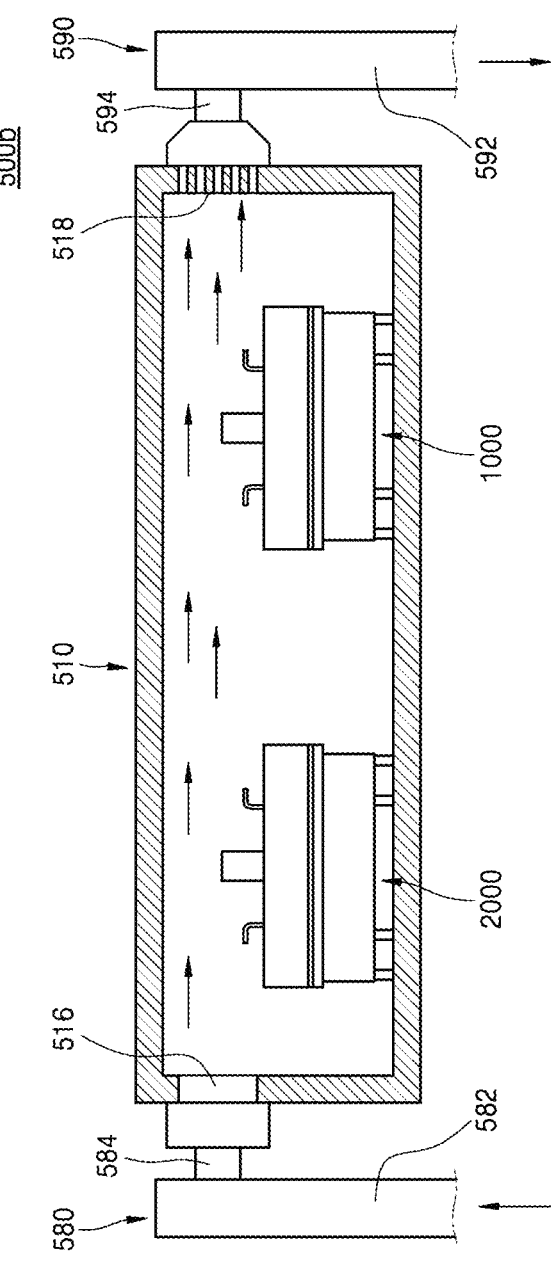

FIGS. 8A and 8B are schematic views of the mechanism between the controller 610 and the gas supply unit 580.

Referring to FIGS. 8A and 8B, when the substrate W is introduced into the bake unit 500b, the entrance 512 may be opened. In this state, air including oxygen may be externally introduced with the substrate W. As illustrated in FIG. 8A, the controller 610 may control such that an inert gas G is injected from the gas supply unit 580 while the entrance 512 is open. The inert gas G injected from the gas supply unit 580 may increase a pressure in the cover 510, and an inflow rate of air including oxygen from the outside may be decreased. Accordingly, the oxygen saturation in the cover 510 may be maintained low.

According to an embodiment, while the inert gas G is injected from the gas supply unit 580, the controller 610 may control the discharge unit 590 to be opened. Accordingly, the inert gas G injected from the gas supply unit 580 may be discharged through the discharge unit 590.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a heat treatment chamber providing a heat treatment space for heat-treating a substrate;
a cooling chamber arranged apart from the heat treatment chamber in a horizontal direction; and
a cover sealing the heat treatment chamber and the cooling chamber,
wherein the cooling chamber comprises:
a housing defining a cooling treatment space therein;
a cooling plate on which the substrate is placed;
a first carry-in/out port arranged in one inner wall of the housing and defining a path through which the substrate is externally carried in/out with respect to the cooling chamber; and
a first purge gas supply unit arranged in an inner wall of the housing and providing a first purge gas to the cooling treatment space, and

wherein the first purge gas supply unit comprises a gas injection hole arranged to face the first carry-in/out port and configured to spray the first purge gas.

2. The substrate processing apparatus of claim 1, further comprising a controller configured to control a supply of the first purge gas by the first purge gas supply unit.

3. The substrate processing apparatus of claim 2, wherein the controller is further configured to control the first purge gas supply unit to inject a first purge gas while the first carry-in/out port is opened.

4. The substrate processing apparatus of claim 2, further comprising a transfer robot configured to transfer the substrate from the heat treatment chamber to the cooling chamber, wherein the controller is further configured to control transfer of the substrate by the transfer robot.

5. The substrate processing apparatus of claim 2, wherein the heat treatment chamber further comprises a second purge gas supply unit providing a second purge gas to the heat treatment space, and the controller is further configured to control a supply of the second purge gas by the second purge gas supply unit.

6. The substrate processing apparatus of claim 5, wherein the heat treatment chamber further comprises a second carry-in/out port defining a path through which the substrate is externally carried in/out with respect to the heat treatment chamber, and the controller is further configured to control the second purge gas supply unit to inject the second purge gas while the second carry-in/out port is opened.

7. The substrate processing apparatus of claim 1, wherein the first purge gas comprises an inert gas having a constant temperature.

8. The substrate processing apparatus of claim 1, wherein the first purge gas comprises an inert gas including nitrogen ($N_2$).

9. A substrate processing apparatus comprising:
a heat treatment chamber providing a heat treatment space for heat-treating a substrate;
a cooling chamber arranged apart from the heat treatment chamber in a horizontal direction; and
a cover sealing the heat treatment chamber and the cooling chamber,
wherein the cooling chamber comprises:
a housing defining a cooling treatment space therein;
a cooling plate on which the substrate is placed;
a first carry-in/out port defining a path through which the substrate is externally carried in/out with respect to the cooling chamber; and
a first purge gas supply unit providing a first purge gas to the cooling treatment space, and
wherein the cover comprises:
a gas supply unit arranged in one side wall inside the cover and providing an inert gas to the inside of the cover; and
a discharge unit arranged in the other side wall opposite to the one side wall and discharging the inert gas
wherein the first purge gas supply unit comprises a gas injection hole arranged to face the first carry-in/out port and configured to spray the first purge gas.

10. The substrate processing apparatus of claim 9, further comprising a controller configured to control a supply of the first purge gas by the first purge gas supply unit and a supply of the inert gas by the gas supply unit.

11. The substrate processing apparatus of claim 10, wherein the controller is further configured to control the gas supply unit to inject the inert gas while the first carry-in/out port is opened.

12. The substrate processing apparatus of claim 11, further comprising a transfer robot configured to transfer the substrate from the heat treatment chamber to the cooling chamber, wherein the controller is further configured to control transfer of the substrate by the transfer robot.

13. The substrate processing apparatus of claim 11, wherein the heat treatment chamber further comprises a second purge gas supply unit providing a second purge gas to the heat treatment space, and the controller is further configured to control a supply of the second purge gas by the second purge gas supply unit.

14. The substrate processing apparatus of claim 13, wherein the heat treatment chamber further comprises a second carry-in/out port defining a path through which the substrate is externally carried in/out with respect to the heat treatment chamber, and the controller is further configured to control the second purge gas supply unit to inject the second purge gas while the second carry-in/out port is opened.

15. The substrate processing apparatus of claim 11, wherein the cover comprises an entrance defining a path through which the substrate is externally carried in/out, and the controller is further configured to control the gas supply unit to inject the inert gas while the entrance is opened.

16. The substrate processing apparatus of claim 10, wherein the controller is further configured to control the discharge unit to be opened while the gas supply unit injects the inert gas.

17. The substrate processing apparatus of claim 10, wherein the first purge gas comprises an inert gas including nitrogen ($N_2$).

18. A substrate processing apparatus comprising:
a heat treatment chamber providing a heat treatment space for heat-treating a substrate;
a cooling chamber arranged apart from the heat treatment chamber in a horizontal direction; and
a cover sealing the heat treatment chamber and the cooling chamber,
wherein the cooling chamber comprises:
a housing defining a cooling treatment space therein;
a cooling plate on which the substrate is placed;
a first carry-in/out port defining a path through which the substrate is externally carried in/out with respect to the cooling chamber;
a first purge gas supply unit arranged in an inner wall of the housing and providing a first purge gas to the cooling treatment space,
wherein the heat treatment chamber comprises:
a second purge gas supply unit providing a second purge gas to the heat treatment space; and
a second carry-in/out port defining a path through which the substrate is externally carried in/out with respect to the heat treatment chamber,
wherein the first purge gas supply unit comprises a gas injection hole through which the first purge gas is injected, and arranged to face the first carry-in/out port, and
wherein the first purge gas comprises an inert gas including nitrogen (N2) and having a constant temperature.

19. The substrate processing apparatus of claim 18, further comprising:

a controller configured to control a supply of the first purge gas by the first purge gas supply unit; and a transfer robot configured to transfer the substrate from the heat treatment chamber to the cooling chamber, wherein the controller is further configured to:

control the first purge gas supply unit to inject a first purge gas while the first carry-in/out port is opened;

control transfer of the substrate by the transfer robot;

control a supply of the second purge gas by the second purge gas supply unit; and control the second purge gas supply unit to inject the second purge gas while the second carry-in/out port is opened.

* * * * *